United States Patent
Harayama

[11] Patent Number: 6,075,260
[45] Date of Patent: Jun. 13, 2000

[54] SEMICONDUCTOR INTEGRATED CIRCUIT DEVICE AND METHOD OF ARRANGING FUNCTIONAL CELL

[75] Inventor: Masahiro Harayama, Kanagawa, Japan

[73] Assignee: NEC Corporation, Tokyo, Japan

[21] Appl. No.: 09/258,571

[22] Filed: Feb. 26, 1999

[30] Foreign Application Priority Data

Feb. 26, 1998 [JP] Japan .................................. 10-045652

[51] Int. Cl.[7] ................................................ H01L 27/118
[52] U.S. Cl. .......................................... 257/206; 257/207
[58] Field of Search ..................................... 257/202–211

[56] References Cited

U.S. PATENT DOCUMENTS

| | | | |
|---|---|---|---|
| 4,766,475 | 8/1988 | Kawashima | 257/207 |
| 5,187,556 | 2/1993 | Nariishi et al. | 257/206 |
| 5,444,275 | 8/1995 | Kugishima et al. | 257/206 |
| 5,517,041 | 5/1996 | Torii et al. | 257/206 |

FOREIGN PATENT DOCUMENTS

| | | | |
|---|---|---|---|
| 63-107144 | 5/1988 | Japan | 257/203 |
| 4-109661 | 4/1992 | Japan | 257/207 |
| 2143990 | 2/1985 | United Kingdom | 257/203 |
| 85/00468 | 1/1985 | WIPO | 257/203 |

*Primary Examiner*—David Hardy
*Attorney, Agent, or Firm*—Scully, Scott, Murphy & Presser

[57] ABSTRACT

In a semiconductor integrated circuit device having a functional cell in which devices constituting a logic circuit of a current mode logic (CML) type are arranged, an input signal and an output signal are complementary signals to each other, and the functional cell is formed into a cross shape so that the devices are arranged so as to be symmetrical in rotation at every 90° for a center point.

13 Claims, 8 Drawing Sheets

SEMICONDUCTOR INTEGRATED CIRCUIT DEVICE AND METHOD OF ARRANGING FUNCTIONAL CELL

BACKGROUND OF THE INVENTION

This invention relates to a semiconductor integrated circuit device and a method of arranging a functional cell, and in particular, a semiconductor integrated circuit device, such as, a gate array on which a logic circuit of super speed operation consisting of CML (Current Mode Logic) is placed and a method of arranging a functional cell.

In a semiconductor integrated circuit device of the type described, impedance of a metal wiring line or pattern can not be ignored in a digital signal process of super high frequency exceeding 600 MHz, such as, timing design.

The logic circuit for processing the digital signal of super high frequency is represented by CML (Current Mode logic). In this event, the CML is composed of a differential amplifier. With such a structure, an input and an output interface with complementary signals of positive phase and negative (or opposite) phase corresponding to an input and an output of the differential amplifier.

In a gate array on which the CML is placed as the logic circuit, there is a difference of impedance caused by a difference of wiring line lengths between signals of the positive phase and the negative phase as the complementary signals between functional cells. In consequence, it is difficult to optimally perform the timing design because the both outputs are unbalanced.

In a conventional semiconductor integrated circuit device of the type described, the wiring line lengths are completed between the positive phase and the negative phase. In particular, with respect to a critical signal path, the functional cell is preferentially forced to be arranged in advance. Further, the wiring line path connected after automatic arranging and wiring process is suitably changed.

Moreover, an arranging position of the functional cell is also changed. Thereby, a balanced arrangement is realized in the conventional semiconductor integrated circuit device.

In the above-mentioned semiconductor integrated circuit device and the method of arranging the functional cell, the position is not always kept to a minimum distance between an output terminal of the functional cell of previous stage and an input terminal of the functional cell of next stage.

Thereby, the impedance difference takes place because the lengths of signal wiring lines of the positive phase and the negative phase of the CML are different from each other.

In this condition, when both lengths of the signal wiring lines are completed to balance both signals, a redundant wiring line must be added to a shorter wiring line to correspond with a length of a longer wiring line. In this case, a delay becomes large because of the redundant wiring line length, and timing margin and power are largely increased.

Further, it is impossible to complete the signal wiring line lengths of the positive phase and the negative phase in only the automatic wiring process. When the difference between the both lengths exceeds an allowable range in the timing design, the wiring line path and the arranging position of the functional cell are manually changed after the automatic wiring process. Consequently, a long time is necessary to converge timing verification.

As a result, design TAT (Turn Around Time) is inevitably increased by the automatic wiring process and correction of the arranging position of the functional cell.

SUMMARY OF THE INVENTION

It is therefore an object of this invention to provide a semiconductor integrated circuit device and a method of arranging a functional cell which is capable of wiring a wiring line (pattern) without adding redundant wiring line to correct variations between signal wiring lines of positive phase and negative phase of CML.

It is an another object of this invention to provide a semiconductor integrated circuit device and a method of arranging a functional cell which is capable of suppressing an increase of design TAT (Turn Around Time) without increasing timing margin or power.

In a semiconductor integrated circuit device according to this invention, the functional cell is formed into a cross shape so that devices are arranged so as to be symmetrical in rotation at every 90° for a center point of the functional cell.

In consequence, an output terminal of the functional cell of a previous stage is opposed to input terminals of the functional cell of the next stage on the same coordinate axis.

Thereby, the functional cells can be wired with a minimum distance. Consequently, it is unnecessary to add the redundant wiring line (pattern). As a result, the respective signals of the positive phase and the negative phase of CML can be matched in impedance, and thereby, the delay, timing margin and an increase of power can be effectively avoided.

Further, it is unnecessary to adjust a wiring line length and correct arrangement due to timing verification after the automatic wiring process by properly arranging the functional cell before the automatic wiring process. In consequence, TAT of the design can be effectively shortened.

DESCRIPTION OF THE PREFERRED EMBODIMENT

Figure 2A:
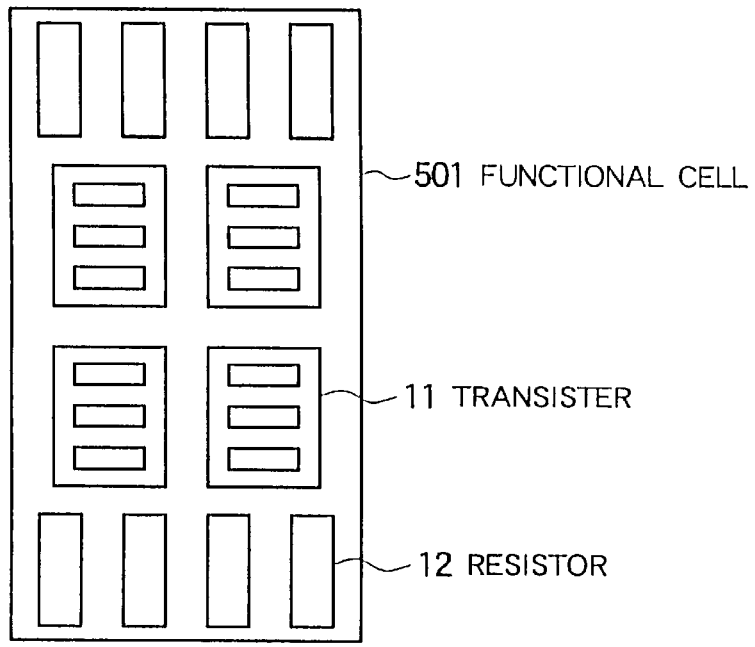
FIG. 2A is a layout diagram showing an example of a cell structure of a conventional semiconductor integrated circuit device.
Figure 2B:
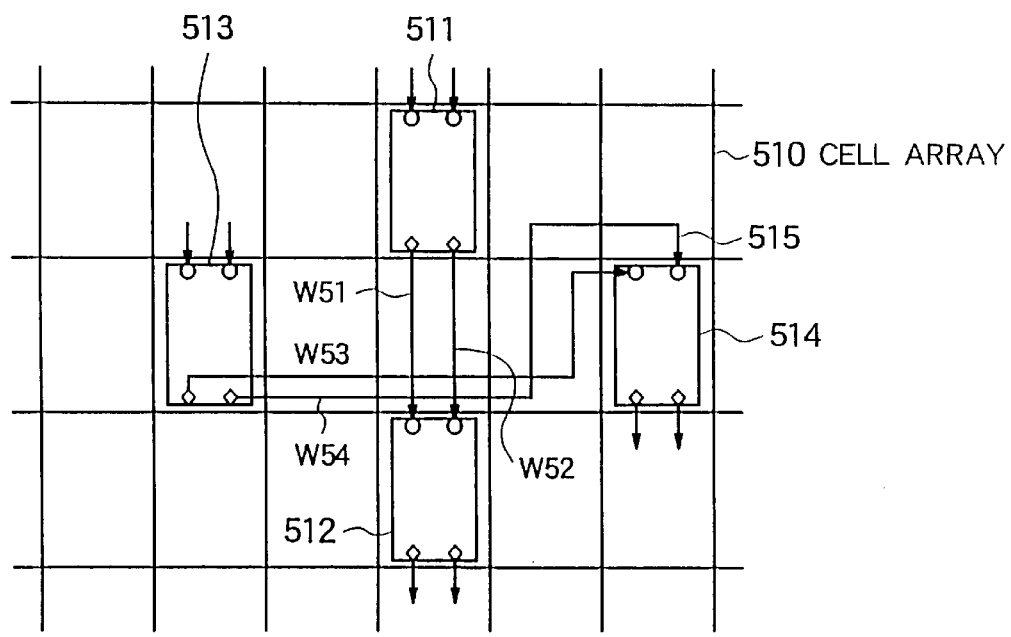
FIG. 2B is a layout diagram showing an example of a cell array structure of a conventional semiconductor integrated circuit device.
Figure 3:
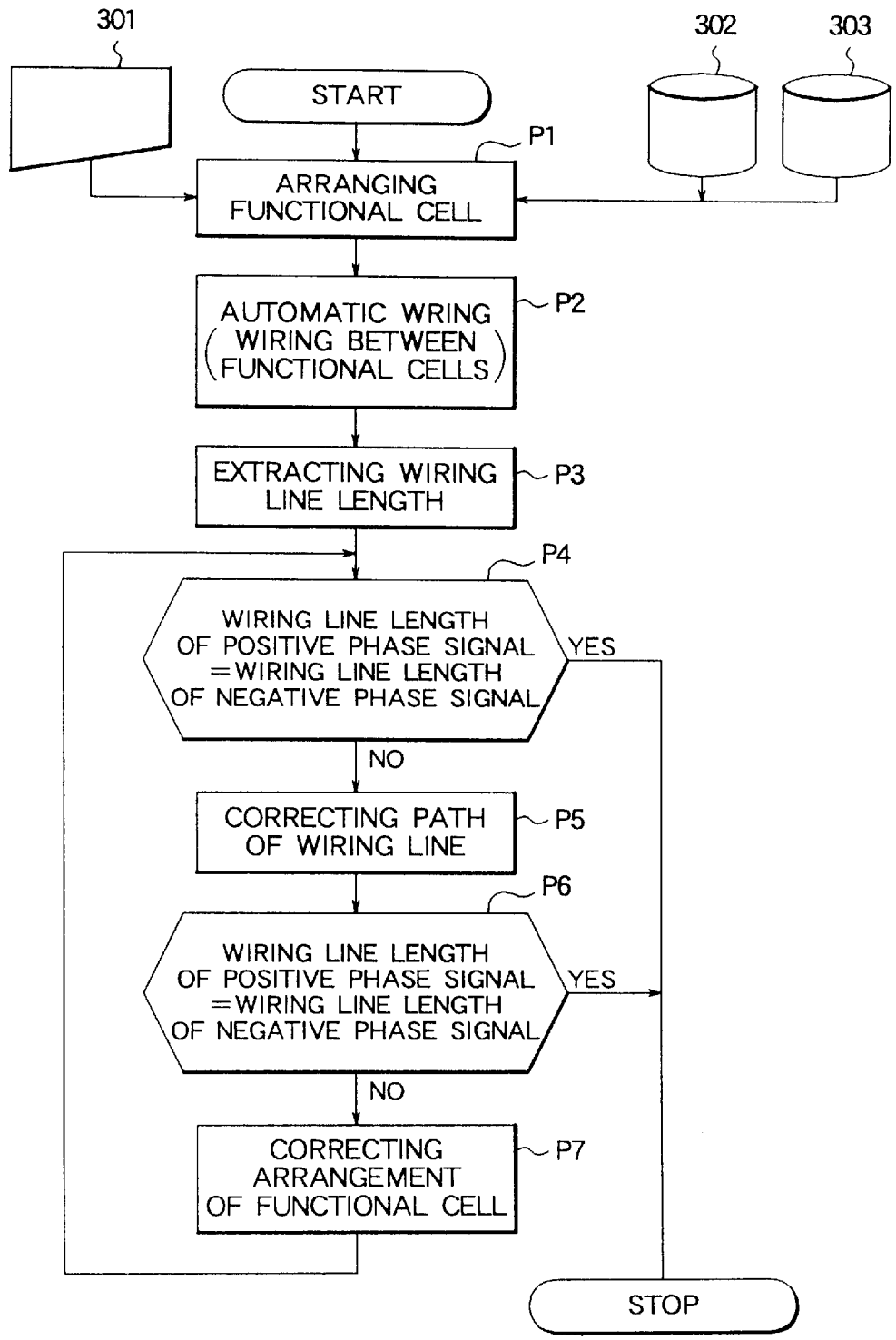
FIG. 3 is a flow chart showing a method of arranging a functional cell in a conventional integrated circuit device.

Referring to FIGS. 1 through 3, a conventional semiconductor integrated circuit device and a method of arranging a functional cell will be first described for a better understanding of this invention.

The semiconductor integrated circuit device and the method of arranging the functional cell are equivalent to the conventional semiconductor integrated circuit device and the method of arranging the functional cell mentioned in the preamble of the instant specification.

Figure 1A:
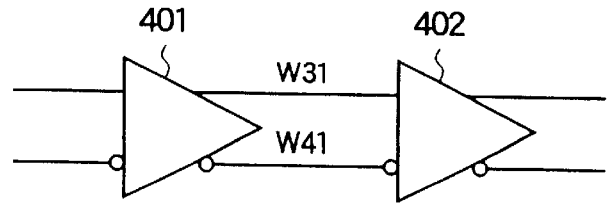
FIG. 1A is a logic connection diagram of a conventional CML functional cell.
Figure 1B:
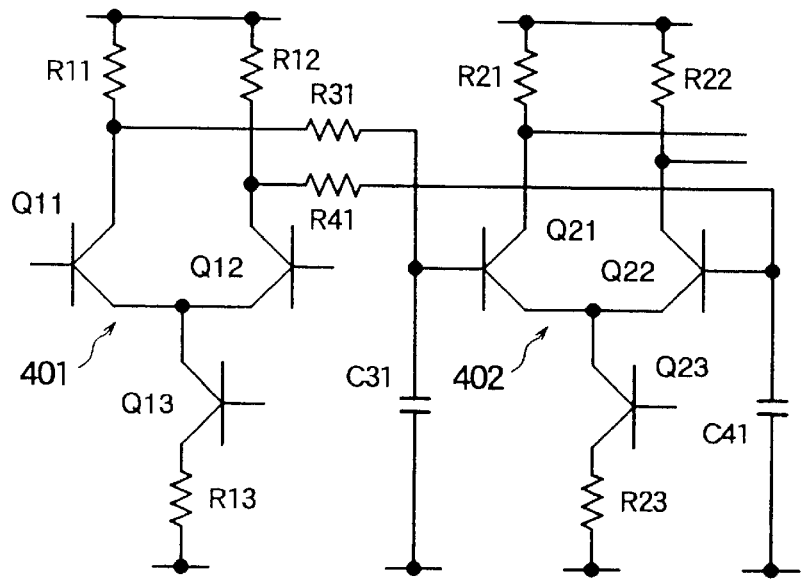
FIG. 1B is a circuit diagram showing a logic circuit of a conventional CML functional cell.

As shown in FIGS. 1A and 1B, a positive phase output of a functional cell 401 of previous stage is given to a positive phase input of a functional cell 402 of next stage via a wiring line (pattern) W31. Likewise, a negative (opposite) phase output is given to a negative (opposite) phase input of the functional cell 402 of the next stage via a wiring line (pattern) W41.

Referring to FIG. 1B, the functional cell 401 includes differential pair transistors Q11 and Q12, a current source transistor Q13, respective load resistors R11 and R12 of the transistors Q11 and Q12, and an emitter resistor R14 of the transistor Q13.

Likewise, the functional cell 402 includes differential pair transistors Q21 and Q22, a current source transistor Q23, respective load resistors R21 and R22 of the transistors Q21 and Q22, and an emitter resistor R24 of the transistor Q23.

With this structure, a resistor 31 between the collector of the transistor Q11 and the base of the transistor Q21 is a parasitic resistor of the wiring line 31 while a resistor 41 between the collector of the transistor Q12 and the base of the transistor Q22 is a parasitic resistor of the wiring line 41.

Further, capacitors C31 and C41 inserted between the respective bases of the transistors Q21, Q22 and the ground indicate parasitic capacitors of the wiring lines, respectively.

Figure 1C:
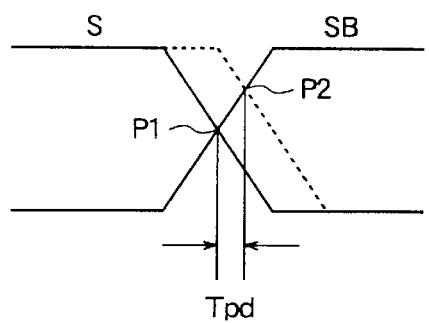
FIG. 1C is an operation waveform of a conventional CML functional cell.

Referring to FIG. 1C, the waveform S of the positive phase and the waveform SB of the negative phase cross at a P1 point in a center when the parasitic resistors R31, R41 and the parasitic capacitor C31, C41 are identical to each other, respectively.

However, when the parasitic resistor R31 and the parasitic capacitor C31 of the positive phase side are larger than the parasitic resistor R41 and the parasitic capacitor C41 of the negative phase side, the waveform is unbalanced and the both waveforms cross at a P2 point over the P1 point. Consequently, the delay Tpd brings about, as illustrated in FIG. 1C.

In a conventional semiconductor integrated circuit device, the wiring line lengths are completed between the positive phase and the negative phase. In particular, with respect to a critical signal path, the functional cell is preferentially forced to be arranged in advance. Further, the wiring line path connected after automatic arranging and wiring process is suitably changed. Moreover, an arranging position of the functional cell is also changed. Thereby, balanced arrangement is realized in the conventional semiconductor integrated circuit device.

Referring to FIG. 2A, the cell 501 for the conventional CML is rectangular in shape. In this event, NPN transistors 11 and resistors 12 that constitute the CML circuit are arranged in the same direction.

Further, referring to FIG. 2B, the conventional cell array 510 is arranged so that all of the functional cells 511 through 514 structuring the cell-array 510 constitute an array structure of the same direction.

As illustrated in FIG. 2B, the functional cell 511 and the functional cell 512 are arranged in line in a vertical direction via a positive phase signal wiring line W51 and a negative phase signal wiring line W52.

Further, the functional cell 513 and the functional cell 514 are arranged in line in a horizontal direction via a positive phase signal wiring line W53 and a negative phase signal wiring line W54.

As illustrated in FIG. 2B, output terminals of a lower side of the functional cell 513 arranged in the horizontal direction are not opposed against input terminals of an upper side of the functional cell 514. Therefore, it is impossible to wire the wiring line W53 and the wiring line W54 in a linear shape. Consequently, the roundabout wiring, which becomes a factor of the difference of the wiring line lengths, is necessary.

On the other hand, the output terminals of the functional cell 511 are opposed to the input terminals of the functional cell 512. In consequence, the wiring lines W51 and W52 can be wired in the linear shape.

Subsequently, description will be made about a conventional method of automatically arranging and wiring functional cells with reference to FIG. 3.

First, the functional cells are arranged on a cell array which is arranged in an array form in the same direction based upon circuit connection information 302 and an automatic wiring database 303 in the step P1.

Next, output terminals and input terminals are connected between the arranged functional cells in the step P2.

Subsequently, the wiring line lengths of the positive phase and the negative phase of each CML are extracted in the step P3. Thereafter, the both wiring line lengths are compared in the step P4. As a result, when the both lengths are identical to each other, the automatic arranging wiring process is terminated, and the process proceeds to the next step.

When the difference exceeds the allowable range and the both lengths are not identical to each other, a wiring path is manually changed in the step 5, and the signal wiring lengths of the positive phase and the negative phase are again compared in the step 6.

The comparison is carried out for each signal path. Consequently, when the both lengths are identical to each other, the automatic arranging wiring process is terminated, and the process proceeds the next step.

When the both lengths are not identical to each other in the change of the wiring path, the positions of the arranged functional cells are again changed. Further, the process again returns to the step P4 to confirm all signal wiring lines.

In the above-mentioned semiconductor integrated circuit device and the method of arranging the functional cell, the position is not always kept to the minimum distance between the output terminal of the functional cell of the previous stage and the input terminal of the functional cell of the next stage. Thereby, the impedance difference takes place because the lengths of the signal wiring lines of the positive phase and the negative phase of the CML are different from to each other.

In this condition, when both signal wiring line lengths are completed to balance between both signals, a redundant wiring line must be added to a shorter wiring line to correspond with a longer wiring line length. In this case, a delay becomes large because of the redundant wiring line length, and timing margin and power are largely increased.

Further, it is impossible to complete the signal wiring line lengths of the positive phase and the negative phase in only the automatic wiring process. When the difference between the both lengths exceeds the allowable range in the timing design, the wiring line path and the arranging position of the functional cell are manually changed after the automatic wiring process.

Consequently, long time is necessary to converge the timing verification. As a result, design TAT (Turn Around Time) is inevitably increased by the automatic wiring process and the correction of the arranging position of the functional cell.

Taking the above-mentioned problem into consideration, this invention provides a semiconductor integrated circuit device and a method of arranging a functional cell which is capable of wiring wiring lines without adding redundant wiring line to correct variation between signal wiring lines of positive phase and negative phase of the CML.

Figure 4:
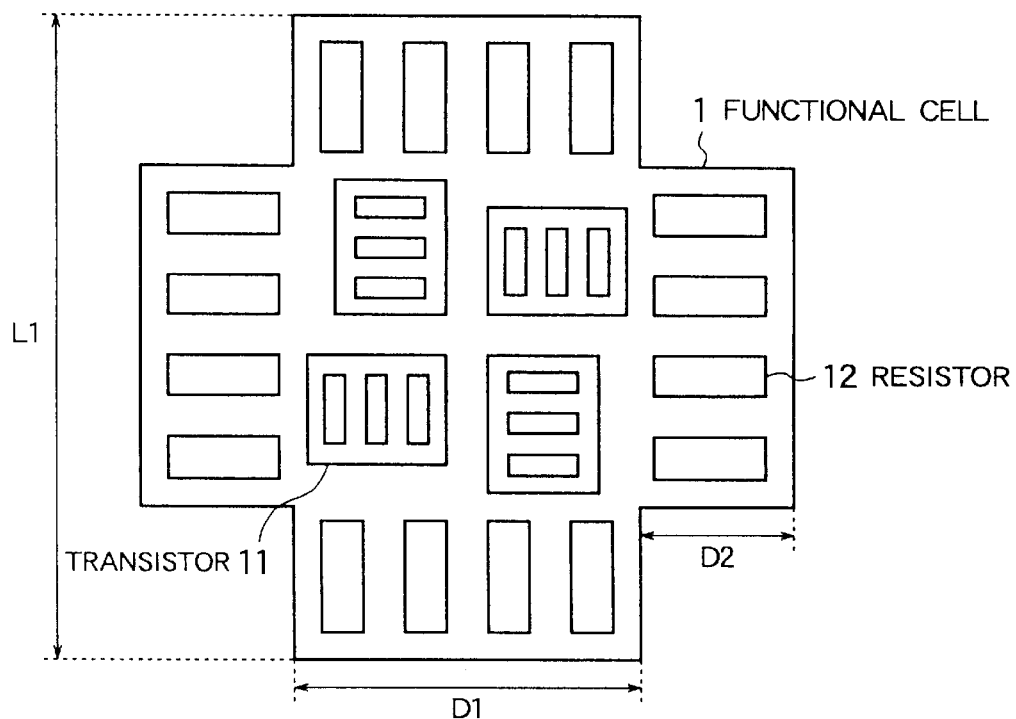
FIG. 4 is a layout diagram showing a cell structure of a semiconductor integrated circuit device according to a first embodiment of this invention.

Subsequently, description will be made about a first embodiment according to this invention with reference with FIG. 4.

A functional cell 1 of a semiconductor integrated circuit device of this embodiment is formed into a cross shape. With such a structure, an NPN transistors 11 and resistors 12, which constitute a CML device, are arranged so as to be symmetrical in rotation at every 90° for a center point of the functional cell 1.

Specifically, the four transistors at total are arranged with every one at every 90° using the center of the functional cell 1.

Further, the sixteen resistors 12 at total are arranged at every four at each side of the cell 1 at every 90° outside of the transistors 11. Thus, the functional cell 1 constitute the cross shape in which the transistors 11 are arranged inside the cell 1 and the resistors 12 are placed at the upper, lower, right and left sides.

In this event, the lengths of the functional cell L1 (cell length) are identical in the vertical and horizontal directions. Further, a width D1 of a projection of the cross shape is substantially twice of a length D2 of the projection.

Subsequently, description will be made about a functional cell 2 of a semiconductor integrated circuit device according to a second embodiment of this invention with reference to FIG. 5.

A functional cell is formed into a cross shape, like the first embodiment. With this structure, NPN transistors 11 and resistors 12, which constitutes a CML device, are arranged so that they are symmetrical with a line for an X axis and a Y axis which pass a center of the cell 2.

Figure 5:
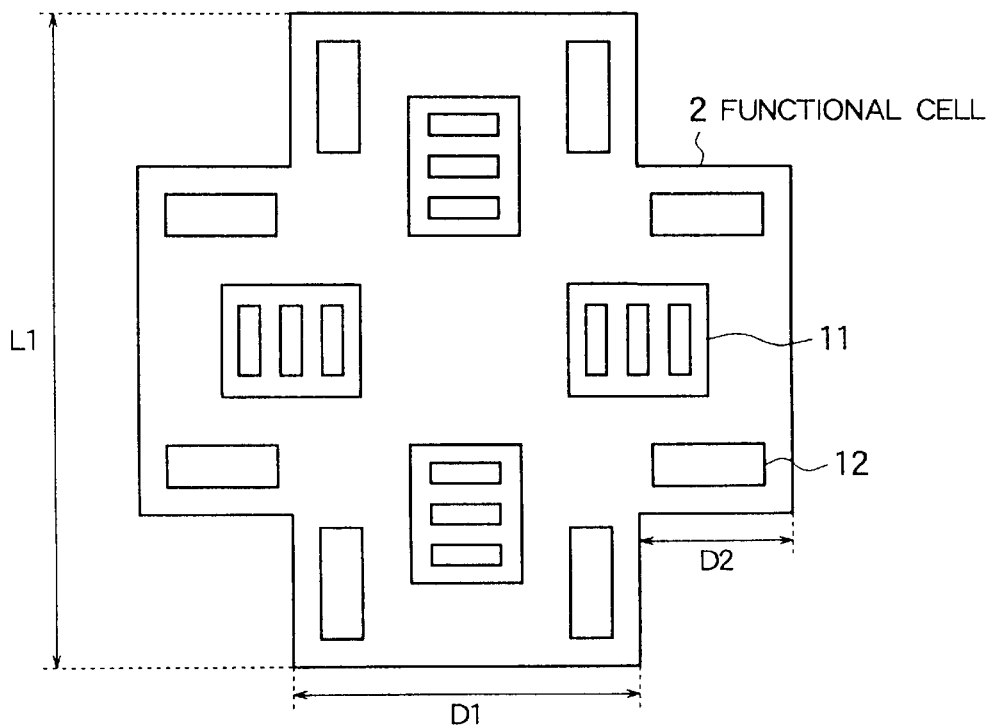
FIG. 5 is a layout diagram showing a cell structure of a semiconductor integrated circuit device according to a second embodiment of this invention.

As illustrated in FIG. 5, four transistors 11 at total are arranged at right and left hand sides of the X-axis and the upper and lower sides of the Y-axis for the cell center. Further, eight resistors 12 at total are arranged with every one at both sides of these four transistors.

In this event, lengths of the functional cell L1 (cell length) are identical in the vertical and horizontal directions. Further, a width D1 of a projection of the cross shape is substantially twice of a length D2 of the projection.

Figure 6:
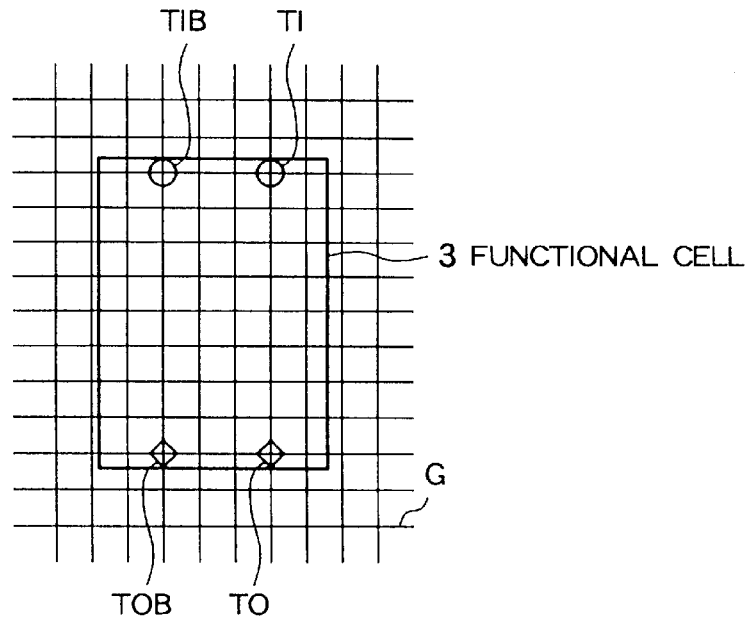
FIG. 6 is a layout diagram showing an example of each position of an input terminal and an output terminal for connecting two cells to be automatically wired.

Referring to FIG. 6, each input terminal TI, TIB is arranged on the same Y axis as each output terminal TO, TOB on wiring lattice G on the basis of the arranging positions for performing automatic wiring process.

Subsequently, description will be made about an example of an array structure of a semiconductor integrated circuit device according to a third embodiment of this invention with reference to FIG. 7.

Figure 7:
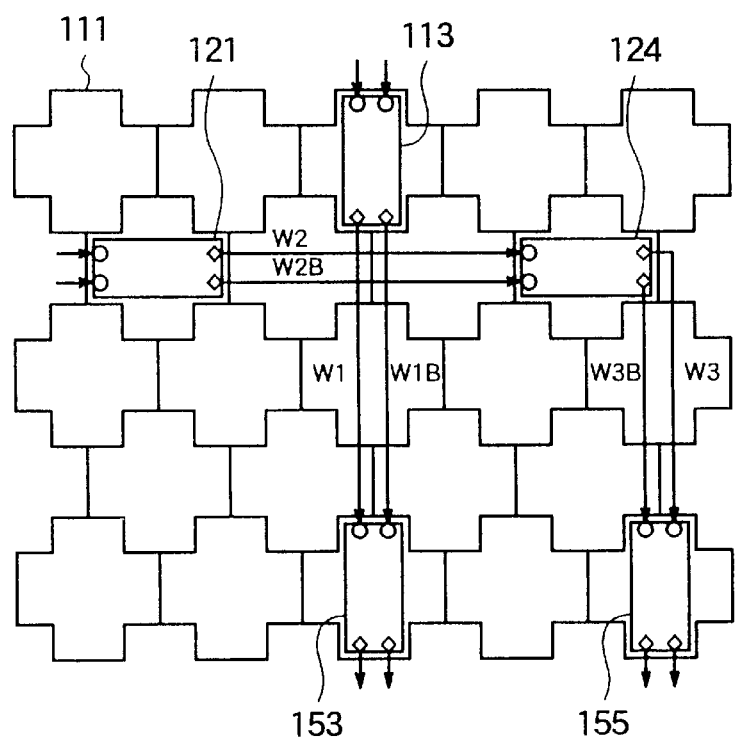
FIG. 7 is a layout diagram showing a cell array structure of a semiconductor integrated circuit device according to a third embodiment of this invention.

A cell array of the semiconductor integrated circuit device illustrated in FIG. 7 is structured by a cell array in which the cell of the first embodiment or the cell of the second embodiment is arranged on a chip. A cell arranged at an arbitrary position is determined as a referential functional cell 111. The same cell as the referential functional cell 111 are arranged in the array form in the X direction with the same pitch as the cell length L1 and in the Y direction with the pitch of 1.5 times of the cell length L1, respectively.

Further, when the array including the functional cell 111 is determined as a first line, the functional cell adjacent to the functional cell 111 of the array of the second line is determined as the second functional cell 121. Herein, the second functional cell 121 is shifted with ½ of the cell length in the X-direction and with ¾ of the cell length in the Y-direction.

The same cells as the referential functional cell 121 are arranged in the array form in the X direction with the same pitch of the cell length and in the Y direction with the pitch of 1.5 times of the cell length, respectively.

Herein, it is to be noted that the functional cells of the first line are sequentially represented by functional cells 111, 112, . . . , the functional cells of the second line are sequentially represented by functional cells 121, 122, . . . , the functional cells of the third line are represented by functional cells 131, 132, . . . .

As will be described later, each of the functional cells 111, 112, . . . , of the first line and the functional cells of the fifth line has the input terminals TI, TIB at the upper side of the cell and the output terminals TO, TOB at the lower side of the cell.

Moreover, each of the functional cells 121, 122, . . . , of the second line has the input terminals TI, TIB at the left side of the cell and the output terminals TO, TOB at the right side of the cell.

In the illustrated example, the output terminals of the functional cell 113 of the first line are connected to the input terminals of the functional cell 153 of the fifth line via wiring lines W1, W1B. Further, the output terminals of the functional cell 121 of the second line are connected to the input terminals of the functional cell 124 via wiring lines W2, W2B.

Moreover, the output terminals of the functional cell 124 of the second line are connected to the input terminals of the functional cell 155 of the fifth line via wiring lines W3, W3B.

Figure 8:
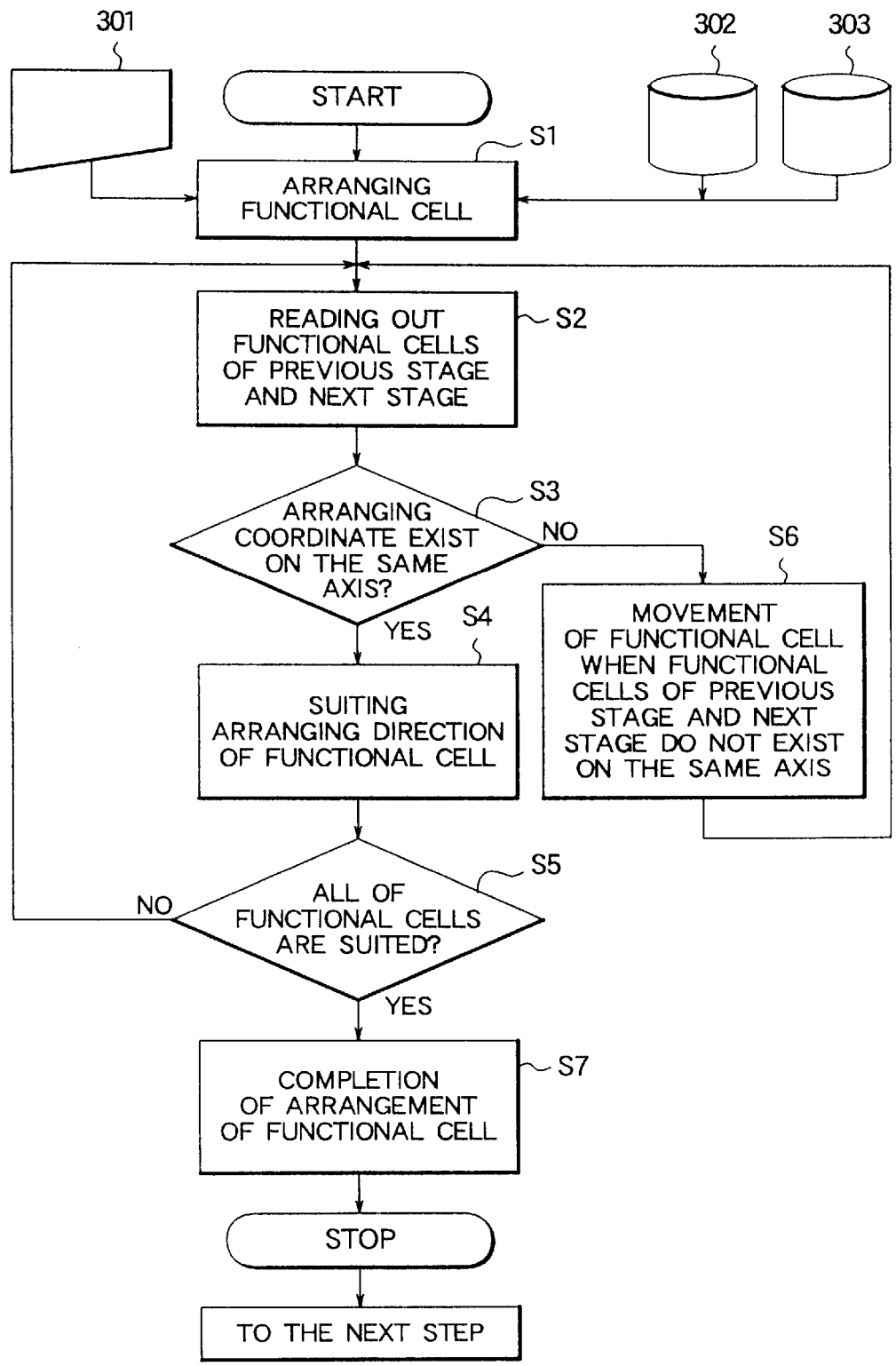
FIG. 8 is a flow chart showing an example of an operation in a method of arranging a functional cell in a semiconductor integrated circuit device according to fourth embodiment of this invention.

Subsequently, description will be made about a method of arranging functional cells of a semiconductor integrated circuit device according to a fourth embodiment of this invention with flow charts illustrated in FIGS. 8 through 10.

In this arranging method, arranging direction suitability in the step S4 and movement of the functional cell in the step 6 are added after the initial arrangement in the conventional flow chart.

First, the functional cells are arranged in the conventional manner based upon circuit connection information 302 and an automatic wiring database 303 in the step S1.

Next, coordinates of a functional cell of the previous stage and a functional cell of the next stage are read out among the arranged functional cells in the step S2.

Thereafter, it is judged whether or not these functional cells of the previous stage and the next stage exist on the same coordinate axis of the X-axis or the Y-axis in the step S3.

When the functional cells exist on the same coordinate axis, the process proceeds to the step S6. In the step S6, the arranging direction and the position of the functional cell are suited.

In the step 5, it is confirmed that all of the signal wiring lines are suited. When they have been suited, the arranging flow of the functional cell is terminated in the step 7.

Figure 9:
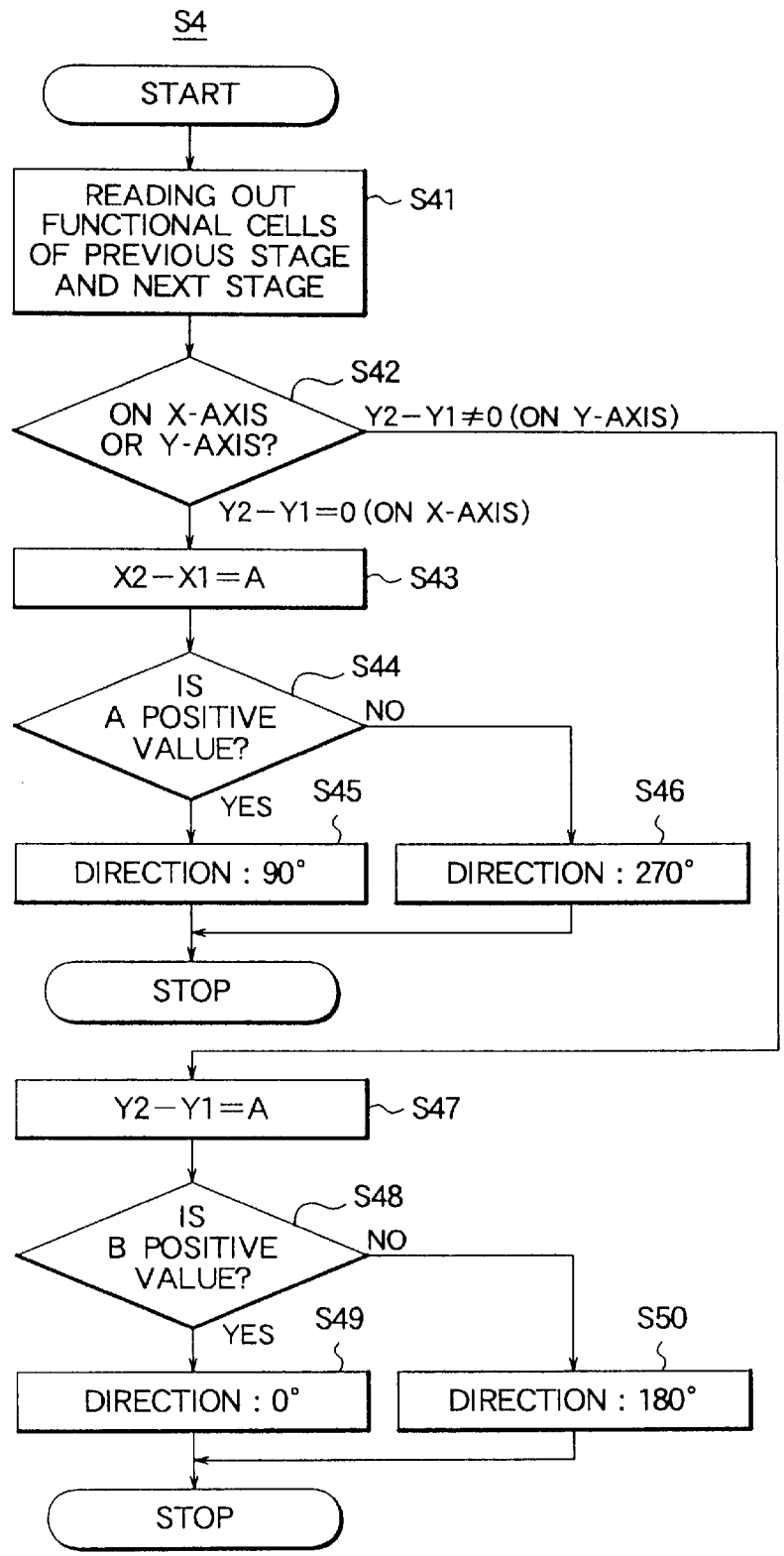
FIG. 9 is a flow chart showing a detail of suitability of an arranging direction of a functional cell illustrated in FIG. 8.

The detail of the arranging direction suitability step S4 is described in FIG. 9. Referring to FIG. 9, the arranging coordinate of the functional cell is read out in the step 41. In the step 42, it is judged that the same coordinate axis exists on either of the X-axis or the Y-axis.

When the X-axis is the same coordinate axis, the positive value or the negative value is judged from the difference of the both coordinates, and the suitable direction is determined in the steps S43–S46. L1kewise, when the Y-axis is the same coordinate axis, the suitable direction is determined in the steps S47–50.

The movement step S6 of the functional cell will be explained with the flowchart illustrated in FIG. 10.

First, the respective differences of the X-coordinate and the Y-coordinate of the functional cell of the previous stage and the functional cell of the next stage are extracted in the step S61. Further, the difference of the above respective difference is extracted in the step S62.

Next, the movement coordinate axis of the functional cell is determined from the difference in the step S63. The movement position of the functional cell is judged based upon the positive value or the negative value from the calculation result in the step S62 (steps S64, S65).

As a result of the judgement in the step S63, when the functional cell of the next stage is moved to the Y-coordinate direction, the functional cell of the next stage is moved with coordinate D in the Y-coordinate in the step S64.

Thereafter, in the step S66, it is judged whether or not the other functional cell is already placed in the moving position of the functional cell. When the other cell is already placed, the priority of the both timing designs is compared in the step 67. As a result, the functional cell having low priority is moved in the step S68, S69.

As a result of the judgement in the step S63, when the functional cell is moved to the X-coordinate, the functional cell of the next stage is moved with the coordinate C in the X-coordinate in the step S65. Thereafter, in the step S70, the process steps S66–S69 of the X-axis are carried out in the same manner.

Again referring to FIGS. 8 through 10, description will be made about the flow operation of the cell arranging method according to this embodiment.

First, the functional cell is arranged in the step S1. The coordinates of the arranging positions of the respective cells of the previous stage and the next stage are read out in the step S2.

Next, in the step S3, it is judged whether or not the arranging positions of the respective cells of the previous stage and the next stage exist on the same coordinate axis. When the arranging position exists on the same coordinate axis of either of the X-axis or the Y-axis, the process proceeds to the step S4. When the arranging position does not exist on the same coordinate axis of either of the X-axis or the Y-axis, the process proceeds to the step S6.

When the arranging positions of the respective functional cells of the previous stage and the next stage exist on the same coordinate axis and the process proceeds to the step S4, the arranging coordinates of the respective functional cells are read out in the step S41.

Thereafter, the difference between the Y-coordinate of the functional cell of the next stage and the Y-coordinate of the functional cell of the previous stage is determined, and it is judged that the value is equal to "0" or other than "0" in the step S42. When the value is "0", it is judged that the respective functional cells are arranged on the same X-axis.

Subsequently, the difference between the X-coordinate of the next stage and the X-coordinate of the previous stage is determined in the step S43, and it is judged that the difference value is positive or negative in the step S44.

When the value is positive, it is judged that the functional cell of the previous stage is positioned at the left-hand side and the functional cell of the next stage is positioned at the right-hand side. It is found out that the flow of the signal directs from the left side toward the right side between the both functional cells.

Therefore, when the functional cell 3 which has input and output terminals and which is illustrated in FIG. 6 is arranged, the both arranging directions are determined as 90° to face the output terminals of the functional cell of the previous stage with the input terminals of the functional cell of the next stage.

On the other hand, when it is judged that the functional cell of the previous stage is positioned at the right hand side and the functional cell of the next stage is positioned at the left hand side in the step 44, the arranging direction is determined as 270° in the like manner.

Moreover, it is judged that the respective functional cells of the previous stage and the next stage are arranged on the Y-axis in the step S42, the directions of the respective functional cells of the previous stage and the next stage are determined in the steps S47–S50.

Thereby, the output terminals of the functional cell of the previous stage and the input terminals of the next stage are arranged so as to be opposed to each other in the same coordinate axis. Further, the respective wiring lines of the positive phase and the negative phase are connected with the same length and minimum distance due to the wiring linearity which is characteristic for preceding the linear wiring process of the automatic wiring tool.

When the arranging positions of the respective cells of the previous stage and the next stage does not exist on the same coordinate axis and the process proceeds to the step S6, the X-coordinate and the Y-coordinate of the functional cells of the previous stage and the next stage are calculated in the step S61, and the difference between the calculated results is determined in the step S62.

In the embodiment, the cell is moved to shorter one of the X or Y-coordinate distances. In consequence, the positive value or the negative value is judged in the step S63. When the value is positive, the Y coordinate of the functional cell of the next stage is moved. On the other hand, when the value is negative, the X-coordinate is moved.

When the Y-coordinate is moved, the distance between Y-coordinate of the functional cell of the next stage and the Y-coordinate of the functional cell of the previous stage is moved. On the other hand, the X-coordinate is moved, the difference distance of the X-coordinate is moved in the like manner.

In this case, referring to FIG. 7, when the signal flow is changed with 90° via the functional cell 124 like the functional cells 121, 124, and 125, the arranging coordinate of the functional cell 155 is determined base upon the wiring line W3B. Consequently, the output terminal coordinate of the functional cell 124 and the input terminal coordinate of the functional cell 155 are completed to each other.

Further, when the Y-coordinate is moved in the step S64, it is judged whether or not the other cell is arranged at the moving position in the step S66.

Moreover, it is judged whether or not the same coordinate exists for all of the arranged functional cells by comparing with the arranging coordinate of the moving position. When the same coordinate exists, the priority between the both coordinates is compared in the step S67.

When the functional cell of the moving position has higher priority than the critical path information 301, the Y-coordinate of the functional cell moved in the step S68 is transferred at every one cell, and this operation is repeated till the functional cell is not overlapped with the other functional cell.

Further, the process returns to the step S2, and the direction is suited in each process of the step S4.

By sequentially repeating this operation for the functional cell of the next stage, all of the functional cells are arranged on the same X-axis or the Y-axis.

Moreover, when it is judged that the X-coordinate of the functional cell of the next stage is moved in the step S63, the functional cell is transferred in the step S70 of the same process as the steps S66–S69 of the moving process of the Y-axis. Thereby, the arranging position and direction are suited.

Subsequently, description will be made about the process flow according to this embodiment using the cell array of the semiconductor integrated circuit device according to the third embodiment illustrated in FIG. 4.

In FIG. 7, the functional cells of the first embodiment are arranged in the array form on the internal logic region. Further, the functional cells 111–115, 121–124, 131–135, 141–144, and 151–155, which are connected between the terminals, are illustrated in FIG. 7.

Herein, description will be again made about the functional cells 113, 153, 155, 121, and 124 relating to the arranging wiring flow of this embodiment.

As mentioned before, each of the functional cells has the input terminals TI, TIM at the upper side of the cell and TO, TOB at the lower side of the cell, and is arranged in 0° direction.

On the other hand, each of the functional cells 121 and 124 has the input terminals TI, TIM at the left side of the cell and output terminals TO, TOB at the right side of the cell, and is arranged in 90° direction.

In this event, the output of the functional cell 113 and the input of the functional cell 153 are connected via the wiring line W1 of the positive phase signal and the wiring line W1B of the negative phase signal.

Further, the output of the functional cell 121 and the input of the functional cell 124 are connected via the wiring line W2 of the positive phase signal and the wiring line of the negative phase signal.

Moreover, the output of the functional cell 124 and the input of the functional cell 155 are connected via the wiring line W3 of the positive phase signal and the wiring line W3B of the negative phase signal.

When the functional cell has the cell length L1 of 100 µm, the side length D1 of 50 µm, the side length D2 of 25 µm in size, the array pitch in one line has 100 µm in the X-direction and 150 µm of 1.5 times thereof in the Y-direction.

Further, when the input terminals TI, TIB and the output terminals TO, TOB of the output terminals of the functional cell are apart with 10 µm from the cell edge, the signal flow between the functional cells 113 and 153 directs from the functional cell 113 toward the functional cell 153.

Consequently, the arranging direction between the both functional cells becomes 0° and the output terminal of the functional cell 113 is opposed to the input terminal of the functional cell 153 on the same Y-axis.

When the automatic wiring process is carried out between these functional cells, the distance between the terminals becomes the total of 200 µm of two cells and the distance between the cell edge and the terminal in each functional cell, and the total becomes 220 µm. Further, each terminal position of the positive phase and the negative phase exists on the same X-axis at the same Y coordinate. In consequence, the both lengths are identical to each other.

In the conventional cell structure, even when shorter wiring line between the positive phase and the negative phase is equal to 200 µm, if the longer wiring line is connected with 300 µm, the redundant wiring line of 100 µm must be added at the shorter one.

In contrast, in this invention, the both become the wiring line length of 200 µm. Thereby, the delay due to the redundant 100 µm, the timing margin and the increase of the power can be effectively avoided.

What is claimed is:

1. A semiconductor integrated circuit device having a functional cell in which devices constituting a logic circuit of a current mode logic (CML) type are arranged, an input signal and an output signal being complementary signals to each other, wherein:

said functional cell has a center point, and said functional cell is formed into a cross shape so that said devices are arranged so as to be symmetrical in rotation at every 90° for the center point.

2. A device as claimed in claim 1, wherein:

said devices comprise a plurality of transistors.

3. A device as claimed in claim 2, wherein:

a plurality of resistors are further arranged in said functional cell, and each of said resistors is arranged at each side of said functional cell at every 90° outside of said transistors.

4. A device as claimed in claim 1, wherein:

said functional cell has a first size in an X-direction and a second size in a Y-direction, said semiconductor integrated circuit device has a first cell array, and said first cell array comprising;

said functional cell which is arranged at a first coordinate as a referential functional cell, a plurality of said functional cells which are arranged in a array form in the X-direction with a pitch of the first size from the first coordinate, and a plurality of said functional cells which are arranged in an array form in the Y-direction with a pitch of 1.5 times of the second size from the first coordinate.

5. A device as claimed in claim 4, wherein:

said functional cell is arranged at a second coordinate, said second coordinate being shifted with ½ of the first size in the X-direction and with ¾ of the second size in the Y-direction from the first coordinate, said semiconductor integrated circuit device has a second cell array, and said second cell array comprising;

a plurality of said functional cells which are arranged in a array form in the X-direction with a pitch of the first size from the second coordinate, and a plurality of said functional cells which are arranged in an array form in the Y-direction with a pitch of 1.5 times of the second size from the second coordinate.

6. A semiconductor integrated circuit device having a functional cell in which devices constituting a logic circuit of a current mode logic (CML) type are arranged, an input signal and an output signal being complementary signals to each other, wherein:

said functional cell has a center point, an X-axis and a Y-axis passing the center point, and said functional cell is formed into a cross shape so that said devices are arranged so as to be symmetrical with a line for the X-axis and the Y-axis, said devices comprise a plurality of transistors.

7. A device as claimed in claim 6, wherein:

a plurality of resistors are further arranged in said functional cell, and each of said resistors is arranged at each side of said functional cell at every 90° outside of said transistors.

8. A semiconductor integrated circuit device having a functional cell in which devices constituting a logic circuit of a current mode logic (CML) type are arranged, an input signal and an output signal being complementary signals to each other, wherein:

said functional cell has a center point, an X-axis and a Y-axis passing the center point, and said functional cell is formed into a cross shape so that said devices are arranged so as to be symmetrical with a line for the X-axis and the Y-axis, said functional cell has a first size in an X-direction and a second size in a Y-direction, said semiconductor integrated circuit device has a first cell array, and said first cell array comprising;

said functional cell which is arranged at a fist coordinate as a referential functional cell, a plurality of said functional cells which are arranged in an array form in the X-direction with a pitch of the first size from the first coordinate, and a plurality of said functional cells which are arranged in an array form in the Y-direction with a pitch of 1.5 times of the second size from the first coordinate.

9. A device as claimed in claim 8, wherein:

said functional cell is arranged at a second coordinate, said second coordinate being shifted with ½ of the first size in the X-direction and with ¾ of the second size in the Y-direction from the first coordinate, said semiconductor integrated circuit device has a second cell array, and said second cell array comprising;

a plurality of said functional cells which are arranged in a array form in the X-direction with a pitch of the first size from the second coordinate, and a plurality of said functional cells which are arranged in an array form in the Y-direction with a pitch of 1.5 times of the second size from the second coordinate.

10. A semiconductor integrated circuit device having a functional cell in which devices constituting a logic circuit of a current mode logic (CML) type are arranged, an input signal and an output signal being complementary signals to each other, comprises:

a wiring lattice for automatically wiring wire lines, said wiring lattice having an X-axis and a Y-axis;

a first functional cell which has at least an input terminal and which is arranged on said wiring lattice; and a second functional cell which has at least an output terminal and which is arranged on said wiring lattice;

the input terminal and the output terminal being placing on the same X-axis or the same Y-axis.

11. A method of arranging a functional cell of a semiconductor integrated circuit device having said functional cell in which devices constituting a logic circuit of a current mode logic (CML) type are arranged, an input signal and an output signal being complementary signals to each other, said functional cell being formed into a cross shape so that said devices are arranged so as to be symmetrical in rotation at every 90° for a center point and comprising the steps of:

reading out coordinates of said functional cell of previous stage and said functional cell of next stage on the basis of circuit connection data information and automatic wiring database;

judging whether or not said functional cells of the previous stage and the next stage exist on the same coordinate axis of an X-axis or a Y-axis; and suiting arranging directions of said functional cells when said functional cells exist on the same coordinate axis, suiting arranging positions and arranging directions of said functional cells when said functional cells do not exist on the same coordinate axis.

12. A method as claimed in claim 11, wherein:

the step for suiting the arranging directions comprises;

determining relative positioning relationship between said functional cell of the previous stage and said functional cell of the next stage based upon the coordinates of said functional cells;

detecting a direction for transferring a signal on the basis of the relative positioning relationship; and opposing an output terminal of said functional cell of the previous stage to an input terminal of said functional cell of the next stage.

13. A method as claimed in claim 11, wherein:

the step for suiting the arranging positions and the arranging directions comprises;

determining a moving coordinate axis and a moving direction of said functional cell of the next stage on the basis of the arranging coordinates of said functional cells of the previous stage and the next stage when said functional cells do not exist on the same coordinate axis of the X-axis and Y-axis; and moving said functional cell of the next stage into a preselected position.

* * * * *

UNITED STATES PATENT AND TRADEMARK OFFICE
CERTIFICATE OF CORRECTION

PATENT NO. : 6,075,260
DATED : June 13, 2000
INVENTOR(S) : Masahiro Harayama

Page 1 of 1

Figure 10:
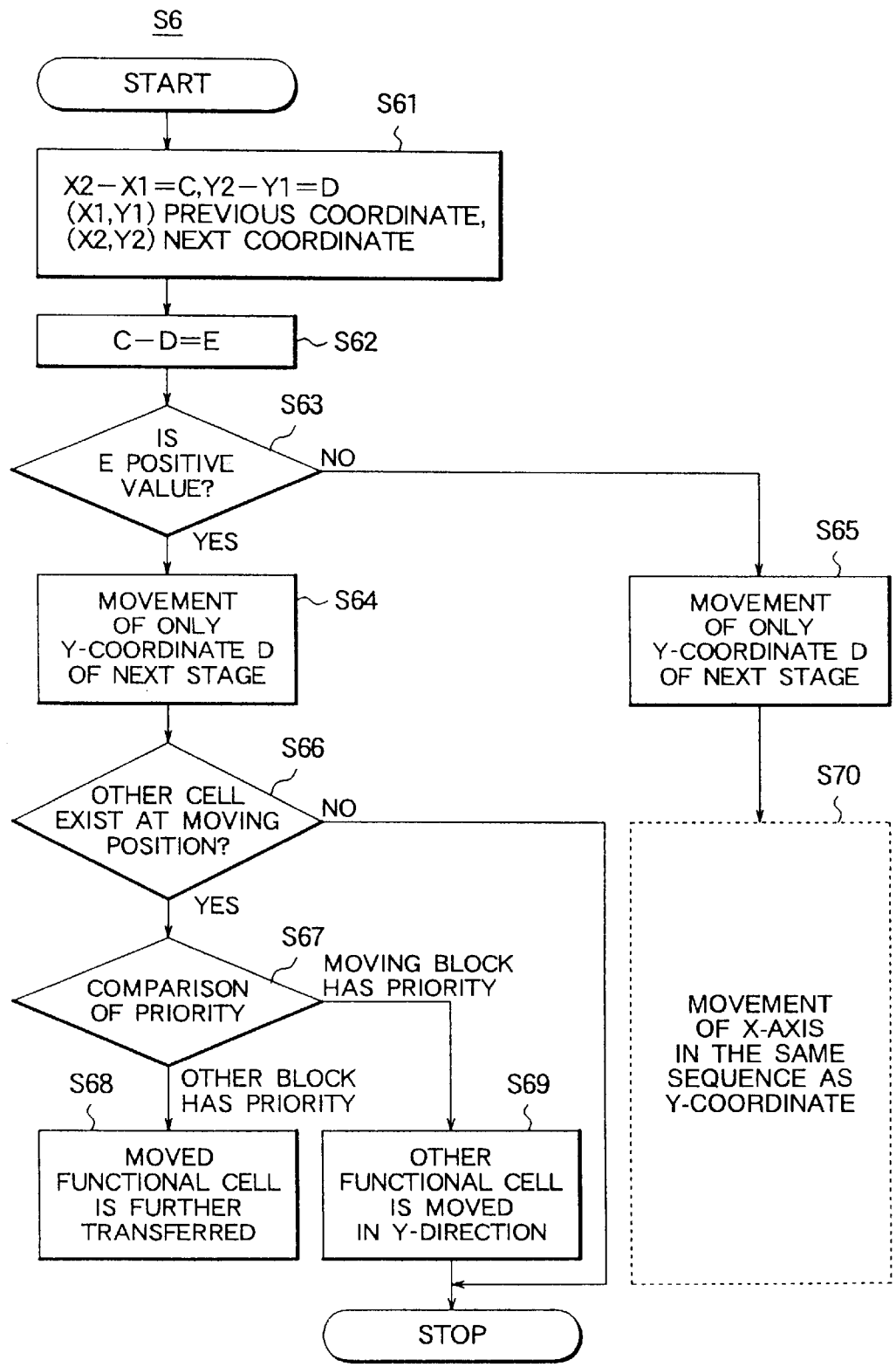
FIG. 10 is a flow chart showing a detail of a movement of a functional cell illustrated in FIG. 8.

It is certified that error appears in the above-identified patent and that said Letters Patent is hereby corrected as shown below:

Figure 10, both instances:

```
MOVEMENT
OF ONLY
Y-COORDINATE D
OF NEXT STAGE
```

Should read - -

```
MOVEMENT
OF ONLY
X-COORDINATE D
OF NEXT STAGE
```

- -

Signed and Sealed this

Twenty-third Day of October, 2001

*Attest:*

*Nicholas P. Godici*

*Attesting Officer*

NICHOLAS P. GODICI
*Acting Director of the United States Patent and Trademark Office*